(12) United States Patent
Lee et al.

(10) Patent No.: US 8,450,680 B2
(45) Date of Patent: May 28, 2013

(54) APPARATUS AND METHOD FOR PROCESSING SUBSTRATE USING NEUTRALIZED BEAMS INCLUDING APPLYING A VOLTAGE TO A SUBSTRATE SUPPORT

(75) Inventors: Do-Haing Lee, Gyeonggi-do (KR); Ha-Na Kim, Seoul (KR); Yong-Jin Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/306,364

(22) Filed: Nov. 29, 2011

(65) Prior Publication Data

US 2012/0068058 A1 Mar. 22, 2012

Related U.S. Application Data

(63) Continuation of application No. 12/323,783, filed on Nov. 26, 2008, now Pat. No. 8,089,042.

(30) Foreign Application Priority Data

Nov. 30, 2007 (KR) ........................ 10-2007-0123631

(51) Int. Cl.
*H05H 3/02* (2006.01)
(52) U.S. Cl.
USPC ........................................................ 250/251
(58) Field of Classification Search
USPC ........................................................ 250/251
See application file for complete search history.

(56) References Cited

U.S. PATENT DOCUMENTS

| 5,110,407 | A  | * | 5/1992 | Ono et al. ...................... 438/696 |
| 6,515,426 | B1 | * | 2/2003 | Tanaka et al. ............. 315/111.81 |
| 6,633,047 | B2 | * | 10/2003 | Niwayama et al. ....... 250/492.21 |
| 7,060,931 | B2 | * | 6/2006 | Yeom et al. .............. 219/121.36 |
| 2004/0222367 | A1 | * | 11/2004 | Ichiki et al. .................... 250/251 |
| 2005/0189482 | A1 | * | 9/2005 | Yeom et al. .................... 250/251 |

(Continued)

FOREIGN PATENT DOCUMENTS

| JP | 2000-235835 | 8/2000 |
| JP | 2005-260195 | 9/2005 |
| JP | 2006-049817 | 2/2006 |
| KR | 1020030042959 | 6/2003 |

OTHER PUBLICATIONS

Micheal Klick, Lutshhornm Ralf Rothe, Plasma School for Semiconductor Manufacturing, Plasmetrex GmbH, pp. IV-45-47, 2007).

*Primary Examiner* — Michael Maskell
(74) *Attorney, Agent, or Firm* — Myers Bigel Sibley & Sajovec, P.A.

(57) ABSTRACT

An apparatus and method for processing a substrate using neutralized beams are provided. A substrate processing apparatus includes an ion source generating device configured to form an ion source. An ion extraction device is configured to extract and accelerate ions from the ion source. An ion neutralizing device is configured to convert the ions extracted and accelerated from the ion extraction device into neutralized beams. A remaining portion of the ions extracted and accelerated from the ion extraction device is not converted into the neutralized beams. A substrate support is configured to support a substrate such that the neutralized beams are directed towards the substrate support. A substrate power supply is configured to apply a voltage to the substrate support such that the remaining portion of the ions that is not converted into the neutralized beams is directed away from the substrate support by the applied voltage of the substrate.

7 Claims, 3 Drawing Sheets

U.S. PATENT DOCUMENTS

2006/0163466 A1* 7/2006 Park et al. ................... 250/251
2006/0213443 A1* 9/2006 Yeom et al. ............. 118/723 FI
2007/0068624 A1* 3/2007 Jeon et al. ................. 156/345.4
2007/0221833 A1* 9/2007 Yeom et al. .................. 250/251

* cited by examiner

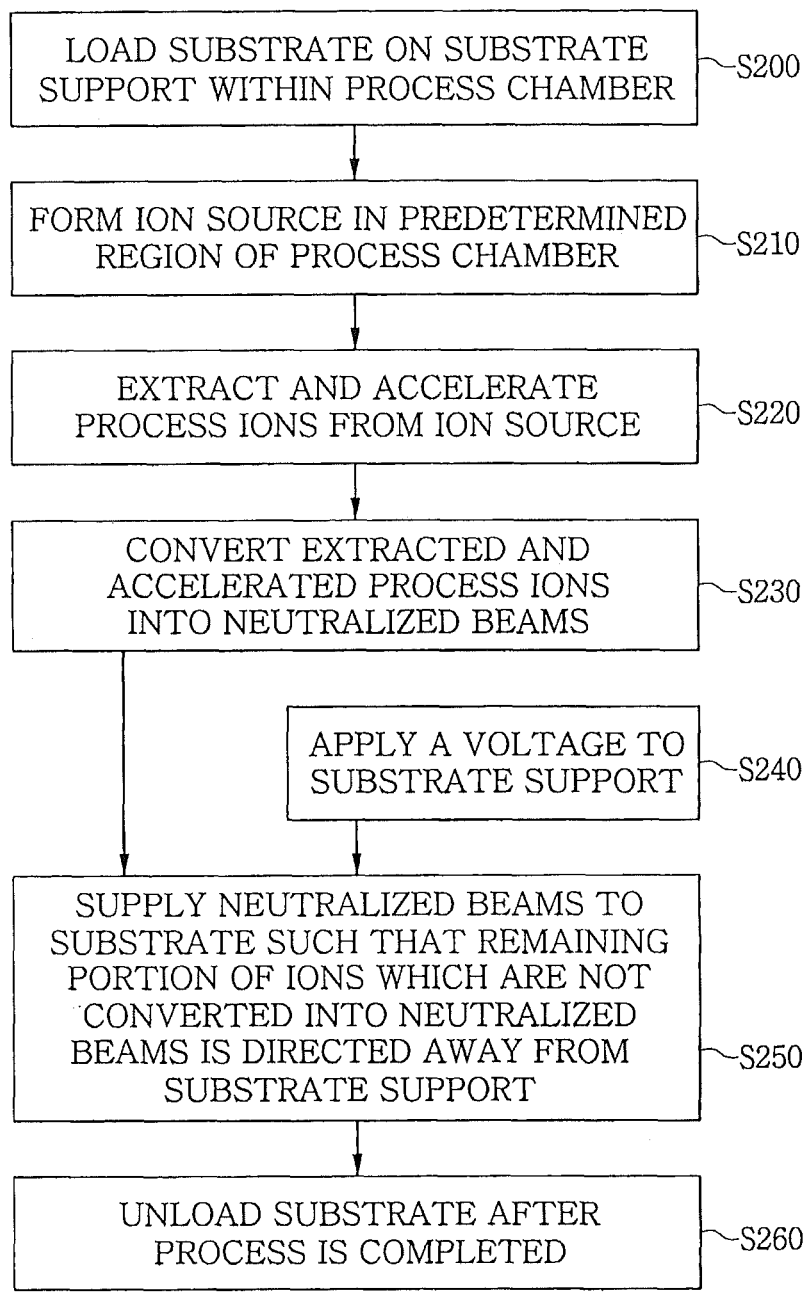

APPARATUS AND METHOD FOR PROCESSING SUBSTRATE USING NEUTRALIZED BEAMS INCLUDING APPLYING A VOLTAGE TO A SUBSTRATE SUPPORT

CROSS-REFERENCE TO RELATED APPLICATION

This application claims is a continuation of and claims priority to U.S. application Ser. No. 12/323,783 filed Nov. 26, 2008, now U.S. Pat. No. 8,089,042 which in turn claims priority to Korean Patent Application No. 10-2007-0123631, filed on Nov. 30, 2007, the contents of which are hereby incorporated herein by reference in their entirety.

FIELD OF THE INVENTION

The present invention relates to an apparatus and method for processing a substrate, and more specifically, to an apparatus and method for processing a substrate using neutralized beams.

BACKGROUND

As semiconductor devices have become highly integrated, design dimensions have been decreasing. Accordingly, process conditions have become stricter, and there is may be desirable to increase the performance for plasma processing.

SUMMARY

According to some embodiments of the current invention, a substrate processing apparatus includes an ion source generating device configured to form an ion source. An ion extraction device is configured to extract and accelerate ions from the ion source. An ion neutralizing device is configured to convert the ions extracted and accelerated from the ion extraction device into neutralized beams. A remaining portion of the ions extracted and accelerated from the ion extraction device is not converted into the neutralized beams. A substrate support is configured to support a substrate such that the neutralized beams are directed towards the substrate support. A substrate power supply is configured to apply a voltage to the substrate support such that the remaining portion of the ions that is not converted into the neutralized beams is directed away from the substrate support by the applied voltage of the substrate.

In some embodiments, the ion source generating device forms plasma serving as the ion source.

In some embodiments, the ion extraction device includes a first grid unit adjacent to the ion source formed by the ion source generating device and a second grid unit positioned opposite to the ion source with the first grid unit interposed therebetween.

In some embodiments, the apparatus further includes first and second grid power supplies connected to the first and second grid units, respectively. The first and second grid power supplies can supply different voltages to the first and second grid units. In some embodiments, the ions have a polarity associated therewith, and the first grid power supply applies a first voltage having a polarity that is the same as the polarity of the ions to the first grid unit, and the second grid power supply applies a second voltage having a different polarity from the ions to the second grid unit. In some embodiments, the voltage that is applied to the substrate support by the substrate power supply has a polarity that is the same as a polarity of a voltage applied to the first grid unit to the substrate support. In some embodiments, the substrate power supply applies a voltage higher than a voltage applied to the first grid unit to the substrate support. The apparatus can include a controller configured to control the substrate power supply and the first grid power supply. In some embodiments, the ion extraction device further includes a third grid unit that is grounded and positioned opposite to the first grid unit with the second grid unit interposed therebetween, and the first, second and third grid units have through-holes in communication with each other.

In some embodiments, the remaining portion of the ions has a polarity associated therewith, and the voltage of the substrate support that is applied by the substrate power supply has a polarity that is the same as the polarity of the remaining portion of the ions.

According to some embodiment of the current invention, substrate processing methods include loading a substrate on a substrate support within a process chamber and forming an ion source in a region within the process chamber. The region may be separated from the substrate support. Ions can be extracted and accelerated from the ion source using an ion extraction device between the ion source and the substrate. The extracted and accelerated ions can be converted into neutralized beams using an ion neutralizing device between the substrate and the ion extraction device. A remaining portion of the ions extracted and accelerated from the ion extraction device is not converted into the neutralized beams. A voltage can be applied to the substrate support with a substrate power supply such that the remaining portion of the ions that is not converted into the neutralized beams is directed away from the substrate support by the applied voltage of the substrate.

In some embodiments, the ion source is formed of plasma.

In some embodiments, the ion extraction device includes a first grid unit adjacent to the ion source and a second grid unit positioned opposite to the ion source with the first grid unit interposed therebetween, and the first and second grid units have through-holes which communicate with each other. The ions can have a polarity associated therewith, and extracting and accelerating the ions can include applying a first voltage having a polarity that is the same as the polarity of the ions to the first grid unit, and applying a second voltage having a polarity that is different from the polarity of the ions to the second grid unit. The voltage applied to the substrate support can be a third voltage having a polarity that is the same as the polarity of the ions and is higher than the first voltage. A magnitude of the voltages applied to the substrate support and the first grid unit can be controlled using a controller connected to the substrate power supply and the first grid power supply. In some embodiments, a third grid unit positioned opposite to the first grid unit with the second grid unit interposed therebetween is grounded.

In some embodiments, the remaining portion of the ions has a polarity associated therewith and the voltage applied to the substrate support has the same polarity as the remaining portion of the ions.

In some embodiments, the methods include performing a process for the substrate using the neutralized beams and unloading the substrate.

BRIEF DESCRIPTION OF THE DRAWINGS

Example embodiments are described in further detail below with reference to the accompanying drawings. It should be understood that various aspects of the drawings may have been exaggerated for clarity:

FIG. 3 is a flowchart showing a substrate processing method according to some embodiments of the current invention.

DETAILED DESCRIPTION OF THE EMBODIMENTS

Figure 1:
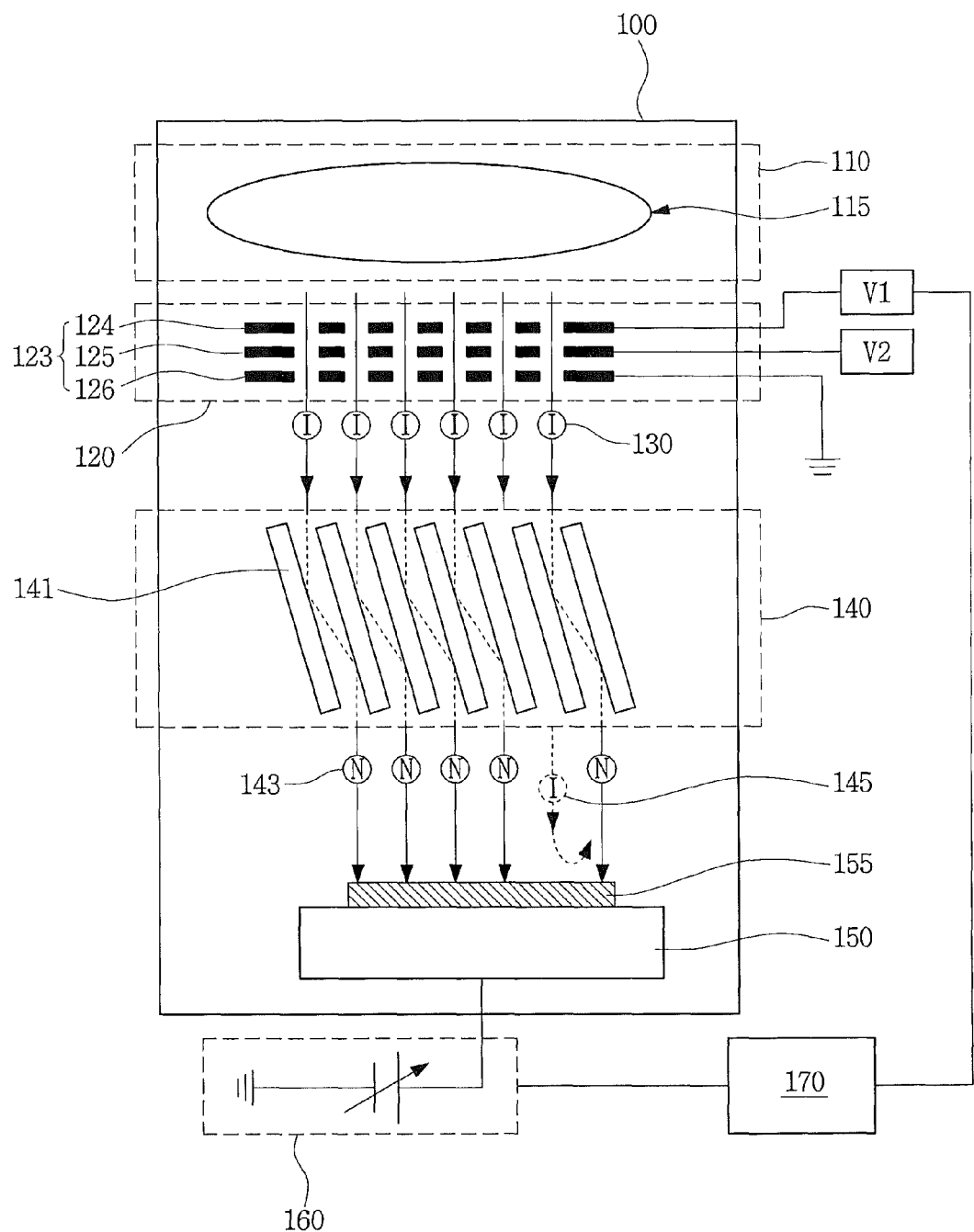
FIG. 1 is a schematic diagram of a substrate processing apparatus according to some embodiments of the current invention.

The present invention now will be described hereinafter with reference to the accompanying drawings and examples, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under." The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present invention. The sequence of operations (or steps) is not limited to the order presented in the claims or figures unless specifically indicated otherwise.

Various example embodiments will now be described more fully with reference to the accompanying drawings in which some example embodiments are shown. In the drawings, the thicknesses of layers and regions may be exaggerated for clarity.

Example embodiments provide an apparatus and method for processing a substrate using neutralized beams, which can reduce or prevent damage to a substrate surface.

The substrate processing apparatus according to embodiments of the current invention will now be described with reference to FIG. 1, which illustrates an ion source generating device 110 for forming an ion source 115. The ion source 115 may be positioned in a region of a process chamber 100. The ion source 115 may include plasma. For example, the ion source 115 may include Capacitive Coupled Plasma (CCP), Electron Cyclotron (ECR) plasma, helicon plasma, or Inductivity Coupled Plasma (ICP). Further, the ion source 115 may include plasma that is modified depending on a process used in the chamber 100.

Inside the process chamber 100, a substrate support 150 may be provided that is separated or spaced-apart from the ion source 115. The substrate support 150 may be configured to support a substrate 155 thereon, for example, a semiconductor wafer.

An ion extraction device 120 may be provided between the region where the ion source 115 is positioned and the substrate support 170. For example, the ion extraction device 120 can include a grid system 123 as shown in FIG. 1. The grid system 123 may include a first grid unit 124, which is adjacent to the ion source 115 of the ion source generating device 110, and a second grid unit 125, which is positioned opposite to the ion source 115 with the first grid unit 124 interposed therebetween. In addition, grid power supplies may be provided, which can apply predetermined voltages to the first and second grid units 124 and 125 such that the first and second grid units 124 and 125 have different electric potentials. For example, a first grid power supply V1 may be connected to the first grid unit 124, and a second grid power supply V2 may be connected to the second grid unit 125. More specifically, as a positive voltage is applied to the first grid unit 121 and a negative voltage is applied to the second grid unit 122, positive process ions 130 may be extracted and accelerated from the ion source 115, such as plasma.

In some embodiments, a third grid unit 126 may be provided. The third grid unit 126 is positioned opposite to the first grid unit 124 with the second grid unit 125 interposed therebetween. The third grid unit 126 may be used to favorably maintain the orientation of the extracted and accelerated positive process ions 130. For example, the third grid unit 126 may be grounded. The first to third grid units 124 to 126 may be disposed parallel to each other. Further, the first to third grid units 124 to 126 may have through-holes in communication with each other. For example, as shown in FIG. 1, the through-holds of the first to third grid units 124 to 126 may form a passage through which the process ions 130 are accelerated.

Between the ion extraction device 120 and the substrate support 150, an ion neutralizing device 140 may be provided. The ion neutralizing device 140 may serve to convert the process ions 130, which are extracted and accelerated by the ion extraction device 120, into neutralized beams 143. The neutralized beams are directed generally toward the substrate support 150. For example, the ion neutralizing device 140 may include a plurality of reflecting plates 141 which are installed parallel to each other in a frame to form a given angle with the movement direction of the extracted and accelerated process ions 130. A remaining portion of the ions 124 extracted and accelerated from the ion extraction device is not converted into the neutralized beams 143.

Figure 2:
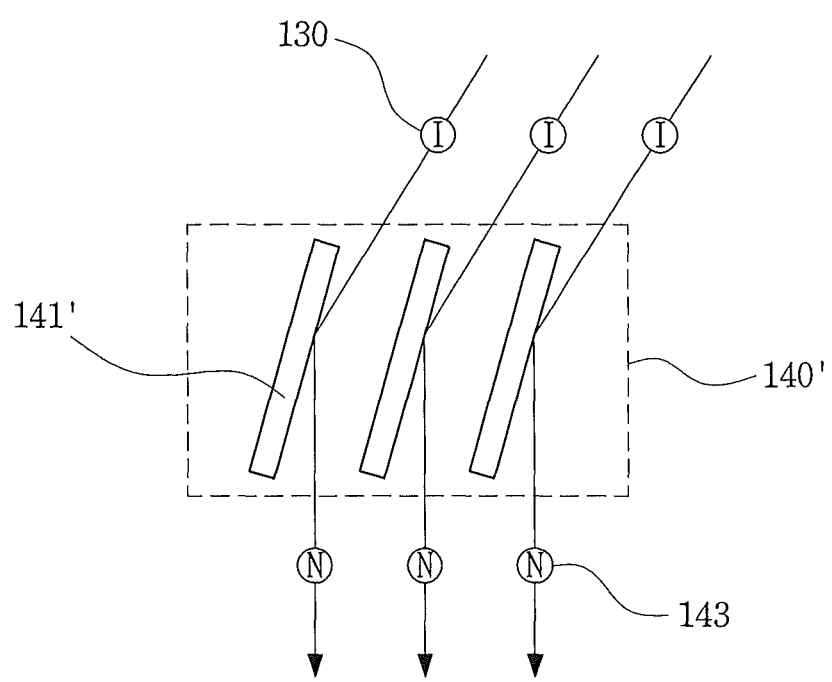
FIG. 2 is a diagram of an ion neutralizing device of the substrate processing apparatus according to some embodiments of the current invention.

As illustrated in FIG. 1, the process ions 130 collide with the reflecting plates 141 two or more times to be neutralized. Therefore, as shown in FIG. 1, the substrate support 150, the ion neutralizing device 140, the ion extraction device 120, and the ion source 115 may be vertically arranged. On the other hand, as shown in FIG. 2, in some embodiments, the extracted and accelerated process ions 130 may collide with reflecting plates 141' from a ion neutralizing device 140' only once to be neutralized. In this case, the propagation direction of the ions 130 extracted and accelerated from the ion extraction device and the propagation direction of the neutralized beams 143 from the ion neutralizing device 140' may form a predetermined angle, as shown in FIG. 2. It should be understood that the extracted and accelerated process ions 130 may be converted into neutralized beams 143 using any suitable technique, including various neutralization methods known to those of skill in the art.

While a semiconductor process using neutralized beams is performed, some ions of the extracted and accelerated process ions 130 may not be converted into the neutralized beams 143. In this case, the remaining portion of the ions 145 which is not converted into the neutralized beams 143 may damage the substrate 155 on the substrate support 150. To reduce or prevent damage to the substrate 155, a substrate power supply 160 may be provided, which can apply a voltage to the substrate support 150 by supplying power to the substrate support 150.

The substrate power supply 160 may serve to apply a voltage to the substrate support 150 such that the remaining portion of the ions 145 is directed away from the substrate support, and the remaining portion of the ions 145 generally does not reach the surface of the substrate 155 on the substrate support 150. Although power is supplied to the substrate support 150 through the substrate power supply 160, the neutralized beams 143 may be directed toward the substrate 155 and reach the substrate 155 because the neutralized beams 143 have no polarity.

The substrate power supply 160 may be a power supply which causes the substrate support 150 to have the same polarity as the remaining portion of the ions 145. For example, when the remaining portion of the ions 145 are positive ions, the substrate power supply 160 may supply a third voltage such that the substrate support 150 has a positive polarity. In this case, the substrate power supply 160 may cause the substrate support 150 to have a larger electric potential than the remaining portion of the ions 145. Meanwhile, the voltage applied to the substrate support 150 by the substrate power supply 160 may be larger than the voltage applied to the first grid unit 124 by the first power supply V1.

Further, a controller 170 may be provided to be connected to the substrate power supply 160 and the first grid power supply V1. The controller 170 may serve to control the substrate power supply 160 and the first grid power supply V1 such that a voltage larger than the voltage applied to the first grid unit 124 can be applied to the substrate support 150.

Hereinafter, a substrate processing method using the substrate processing apparatus will be described.

Referring to FIGS. 1 to 3, a substrate 155 may be loaded on a substrate support 150 within a process chamber 100 (step S200). Subsequently, the process chamber 100 may be set in a vacuum state. An ion source 115 may be formed in a region of the process chamber 100 by an ion source generating device 110 (step S210). The ion source 115 may be formed of CCP, ECR plasma, helicon plasma, or ICP. Further, the ion source 115 may be formed of plasma which is modified depending on each process.

Process ions 130 may be extracted and accelerated from the ion source 115 by an ion extraction device 120 (step S220). For example, the process ions 130 may be extracted and accelerated by the ion extraction device 120 such as a grid system 123. As described above, the grid system 123 may include first to third grid units 124 to 126. More specifically, predetermined voltages may be applied to the first and second grid units 124 and 125 such that the first and second grid units 124 and 125 have different electric potentials from each other. For example, a positive first voltage is applied to the first grid unit 124 by a first grid power supply V1 connected to the first grid unit 124, and a negative second voltage is applied to the second grid unit 125 by a second grid power supply V2 connected to the second grid unit 125. Then, the positive process ions 130 may be extracted and accelerated from the ion source 115 formed of plasma. Meanwhile, the third grid unit 126, which is positioned opposite to the first grid unit 124 with the second grid unit 125 interposed therebetween, may be grounded, e.g., to favorably maintain the orientation of the extracted and accelerated positive process ions 130.

Subsequently, the process ions 130 may be converted into neutralized beams 143 by an ion neutralizing device 140 (step S230). Among the process ions 130, 99.5 to 99.9% of ions are converted into the neutralized beams 143, and 0.5 to 0.1% of the remaining portion of the ions 145 may not be neutralized. The above ratio at which the process ions 130 are converted into the neutralized beams 143 is only a numerical example. It should be understood that, depending on the state of the processing equipment, the ratio may differ.

If the remaining portion of the ions 145 which is not neutralized reaches the surface of the substrate 155, the substrate 155 may be damaged. Therefore, a voltage can be applied to the substrate support 150, i.e., by supplying power to the substrate support 150 by a substrate power supply 160, such that the remaining portion of the ions 145 is directed away from the substrate 155 (step S240). More specifically, power may be supplied to the substrate support 150 by the substrate power supply 160 such that the substrate support 150 has the same polarity as the remaining portion of the ions 145. For example, when the remaining portion of the ions 145 are positive ions, a DC voltage may be applied to the substrate support 150 by the substrate power supply 160 such that the substrate support 150 has a positive polarity. The remaining portion of the ions 145 can thus be generally prevented from reaching the substrate support 150.

In some embodiments, the substrate support 150 may be set to have a higher electric potential than the remaining ions 145 such that the remaining portion of the ions 145 does not reach the surface of the substrate 155 on the substrate support 150. For example, a first voltage may be applied to the first grid unit 124, and a third voltage may be applied to the substrate support 150. The third voltage may be higher than the first voltage. The relative magnitude between the first and third voltages may be determined by a controller 170 connected to the substrate power supply 160 and the first grid power supply V1. That is, the third voltage applied to the substrate support 150 may be varied.

Therefore, while the neutralized beams 143 are selectively supplied to the substrate 155, the remaining portion of the ions 145 which are not neutralized through the ion neutralizing device 140 among the extracted and accelerated ions 130 can be directed away from the substrate support 150 (step S250). After the process is completed using the neutralized beams 143 while preventing the remaining ions 145 from reaching the substrate 155, the substrate 155 may be unloaded (step S260).

According to the embodiments of the current invention, a voltage is applied to a substrate support such that the remaining portion of the ions which is not converted into neutralized beams can be directed away from the substrate support and damage to the substrate and/or substrate support is reduced or prevented. In some embodiments, the density of plasma or uniform the distribution of plasma may be increased.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A substrate processing method comprising:
    loading a substrate on a substrate support within a process chamber;
    forming an ion source in a region within the process chamber, the region being separated from the substrate support;
    extracting and accelerating ions from the ion source using an ion extraction device between the ion source and the substrate;
    converting the extracted and accelerated ions into neutralized beams using an ion neutralizing device between the substrate and the ion extraction device, wherein a remaining portion of the ions extracted and accelerated from the ion extraction device is not converted into the neutralized beams; and
    applying a voltage to the substrate support with a substrate power supply such that the remaining portion of the ions that is not converted into the neutralized beams is directed away from the substrate support by the applied voltage of the substrate, wherein the ion extraction device includes a first grid unit adjacent to the ion source and a second grid unit positioned opposite to the ion source with the first grid unit interposed therebetween, and the first and second grid units have through-holes which communicate with each other;
    wherein the ions have a polarity associated therewith, and wherein extracting and accelerating the ions includes:
    applying a first voltage having a polarity that is the same as the polarity of the ions to the first grid unit; and
    applying a second voltage having a polarity that is different from the polarity of the ions to the second grid unit.

2. The substrate processing method according to claim 1, wherein the ion source is formed of plasma.

3. The substrate processing method according to claim 1, wherein the voltage applied to the substrate support comprises a third voltage having a polarity that is the same as the polarity of the ions and is higher than the first voltage.

4. The substrate processing method according to claim 3 further comprising: controlling a magnitude of the voltages applied to the substrate support and the first grid unit using a controller connected to the substrate power supply and the first grid power supply.

5. The substrate processing method according to claim 1 further comprising: grounding a third grid unit positioned opposite to the first grid unit with the second grid unit interposed therebetween.

6. The substrate processing method according to claim 1, wherein the remaining portion of the ions has a polarity associated therewith and the voltage applied to the substrate support has the same polarity as the remaining portion of the ions.

7. The substrate processing method according to claim 1 further comprising: performing a process for the substrate using the neutralized beams; and unloading the substrate.

* * * * *